(12) United States Patent
Sekiya et al.

(10) Patent No.: US 9,347,559 B2
(45) Date of Patent: May 24, 2016

(54) PISTON RING

(75) Inventors: Takuma Sekiya, Kashiwazaki (JP);
Yuuichi Murayama, Kashiwazaki (JP);
Masayuki Sato, Kashiwazaki (JP); Yuji Shima, Kashiwazaki (JP); Junya Takahashi, Kashiwazaki (JP); Masaki Moronuki, Kashiwazaki (JP)

(73) Assignee: KABUSHIKI KAISHA RIKEN, Tokyo (JP)

( * ) Notice: Subject to any disclaimer, the term of this patent is extended or adjusted under 35 U.S.C. 154(b) by 0 days.

(21) Appl. No.: 14/129,050

(22) PCT Filed: Jun. 21, 2012

(86) PCT No.: PCT/JP2012/065880
§ 371 (c)(1),
(2), (4) Date: Dec. 23, 2013

(87) PCT Pub. No.: WO2012/176846
PCT Pub. Date: Dec. 27, 2012

(65) Prior Publication Data
US 2014/0125013 A1 May 8, 2014

(30) Foreign Application Priority Data

Jun. 24, 2011 (JP) .................................. 2011-140752
Oct. 28, 2011 (JP) .................................. 2011-237589

(51) Int. Cl.
*C23C 14/06* (2006.01)
*F16J 9/26* (2006.01)
(Continued)

(52) U.S. Cl.
CPC ............... *F16J 9/26* (2013.01); *C23C 14/0641* (2013.01); *C23C 14/325* (2013.01); *C23C 28/044* (2013.01); *C23C 28/046* (2013.01)

(58) Field of Classification Search
USPC ................... 277/442; 428/336, 408, 457, 698
See application file for complete search history.

(56) References Cited

U.S. PATENT DOCUMENTS 4,895,765 A * 1/1990 Sue et al. ...................... 428/698
5,071,693 A * 12/1991 Sue et al. ...................... 428/216
(Continued)

FOREIGN PATENT DOCUMENTS

JP  63-223147  * 9/1988
JP  02-254153  * 10/1990
(Continued)

OTHER PUBLICATIONS

Ding, et al., "Thermal conductivity of CrAlN and TiAlN coatings deposited by lateral rotating cathode arc", SIM Tech Technical Reports, vol. 11, No. 2, pp. 81-85, Apr.-Jun. 2010.
(Continued)

*Primary Examiner* — Archene Turner
(74) *Attorney, Agent, or Firm* — Birch, Stewart, Kolasch & Birch, LLP (57) ABSTRACT

A high-thermal-conductivity piston ring having excellent scuffing resistance and wear resistance, which can be used in a high-heat-load environment in engines is provided. Also, to provide a piston ring with low friction for contributing to the improvement of fuel efficiency, a TiN coating as thick as 10-60 μm, in which the texture coefficient of a (111) plane is 1.2-1.65 in X-ray diffraction on the coating surface, with the texture coefficient of a (111) plane>the texture coefficient of a (220) plane>the texture coefficient of a (200) plane, is formed under the optimized ion plating conditions on a peripheral surface of the piston ring. Further, to obtain excellent sliding characteristics with low friction without losing excellent thermal conductivity of TiN, a hard amorphous carbon coating is formed on the TiN coating.

4 Claims, 3 Drawing Sheets

(51) Int. Cl.
  *C23C 14/32* (2006.01)
  *C23C 28/04* (2006.01)

(56) References Cited

U.S. PATENT DOCUMENTS

| | | | |
|---|---|---|---|
| 5,126,030 A * | 6/1992 | Tamagaki et al. | 204/192.38 |
| 5,234,560 A * | 8/1993 | Kadlec et al. | 204/192.16 |
| 5,449,547 A | 9/1995 | Miyazaki et al. | |
| 5,582,414 A | 12/1996 | Miyazaki et al. | |
| 6,048,625 A | 4/2000 | Miura et al. | |
| 6,139,022 A * | 10/2000 | Iwashita et al. | 277/443 |
| 6,279,913 B1 * | 8/2001 | Iwashita et al. | 277/442 |
| 6,527,879 B2 * | 3/2003 | Kubota et al. | 420/104 |
| 6,546,808 B2 * | 4/2003 | Matsuoka et al. | 73/799 |
| 7,255,084 B2 * | 8/2007 | Savale et al. | 123/193.6 |
| 7,404,940 B2 * | 7/2008 | Higgins et al. | 423/242.1 |

FOREIGN PATENT DOCUMENTS

| | | | |
|---|---|---|---|
| JP | 2-259048 A | | 10/1990 |
| JP | 03-031469 | * | 2/1991 |
| JP | 05-078820 | * | 3/1993 |
| JP | 05-193916 | * | 8/1993 |
| JP | 6-94130 A | | 4/1994 |
| JP | 6-172970 A | | 6/1994 |
| JP | 6-221436 A | | 8/1994 |
| JP | 6-265023 A | | 9/1994 |
| JP | 6-346224 A | | 12/1994 |
| JP | 11-172413 A | | 6/1999 |
| JP | 11-230342 A | | 8/1999 |
| JP | 2000-274531 A | | 10/2000 |
| JP | 2000-337511 A | | 12/2000 |
| JP | 2002-332561 A | | 11/2002 |
| JP | 2004-137535 | * | 5/2004 |
| JP | 2005-272997 | * | 10/2005 |
| JP | 2008-297477 | * | 12/2008 |
| JP | 2009-299142 A | | 12/2009 |

OTHER PUBLICATIONS

International Search Report, mailed Aug. 7, 2012, issued in PCT/JP2012/065880.
Takeo Oki, "Surface Hardening by Dry Process and Its Trend", Surface Technology, vol. 41, No. 5, pp. 462-470, 1990.
The extended European search report, dated Nov. 12, 2014, issued in the corresponding European Patent Application No. 12802719.0.

* cited by examiner

PISTON RING

FIELD OF THE INVENTION

The present invention relates to a piston ring for automobile engines, particularly to a high-thermal-conductivity piston ring having excellent scuffing resistance and wear resistance.

BACKGROUND OF THE INVENTION

Because of increase in engine powers and severer environmental regulations of exhaust gases, piston rings having ion-plated, hard chromium nitride coatings for high scuffing resistance and wear resistance have long been used. Because piston rings used in severe environment in engines should have long lives, hard coatings are required to be as thick as 10-60 μm. Because Cr has a relatively high vapor pressure among metals, a chromium nitride coating can be formed to a required thickness relatively easily, so that it has been conveniently used in the piston ring industry.

Because such chromium nitride is generally hard but is easily broken, various measures such as crystal orientation control, structure control, porosity control, the addition of third elements, etc., have been conducted. However, there is recently demand to further improve the thermal conductivity of CrN, because recent trend of higher compression ratios and higher loads in engine specifications causes new problems of higher combustion chamber temperatures and knocking. In addition, when pistons are made of aluminum alloys (hereinafter called simply "aluminum"), softened aluminum causes the wearing of ring grooves and is adhered to piston rings. To tackle this problem, heat is required to be dissipated from pistons to cooled cylinder walls through piston rings, by effectively utilizing the thermal conduction of piston rings. However, CrN with low thermal conductivity hinders the thermal conduction of piston rings. Non-Patent Reference 1 reports that the thermal conductivity of CrN is 0.0261-0.0307 cal/cm·sec·deg (corresponding to 10.9-12.9 W/m·K (by SI), and Non-Patent Reference 2 reports that the thermal conductivity (room temperature) of a thin CrN film of about 3 μm is about 2 W/m·K (when measured by a light pulse thermoreflectance method. Though the thermal conductivity is measured in planar and thickness directions, it is difficult to measure the thermal conductivity of a coating of several tens of μm in a thickness direction. Apart from such difficulty, it is considerably lower than the thermal conductivity of 20-30 W/m·K of SUS440B and SUS420J2, typical steels for piston rings, and such low thermal conductivity is considered a large factor of hindering the thermal conduction.

Titanium nitride (TiN) has also been proposed for hard coatings for piston rings, and actually used in some of piston rings. The thermal conductivity of TiN is 0.07 cal/cm·sec·deg (room temperature) (corresponding to 29.3 W/m·K (by SI) in Non-Patent Reference 1, and 11.9 W/m·K (in Non-Patent Reference 2, 3-6 times as high as that of CrN. However, it has extremely high residual compression stress inside the coating, which suffers cracking, breakage, peeling, etc. when it is thick. Accordingly, TiN cannot actually be coated to a thickness required for piston rings. Patent Reference 1 describes that the control of TiN to have a columnar crystal structure provides a TiN coating with smaller residual stress, enabling the TiN coating as thick as 80 μm at maximum, and that having a predominant orientation in a (111) or (200) plane in parallel to the coating surface is particularly preferable from the aspect of scuffing resistance.

Patent Reference 2 describes that mere increase in the intensity ratio of a (111) plane in a TiN film may not provide sufficient wear resistance, and that excellent wear resistance is obtained by increasing the intensity ratio of a (111) plane and reducing the intensity ratio of a (220) plane in X-ray diffraction.

Though the orientation of a (111) plane, a surface of a close-packed structure of TiN, in parallel to the coating surface is effective for improving the scuffing resistance and wear resistance as described in Patent References 1 and 2, TiN coatings with too strong orientation actually have large residual stress as described above, difficult to be used for piston rings. For example, even if a TiN coating as thick as up to 30 μm were formed, the peeling of the coating, etc. would occur when actually used for piston rings.

PRIOR ART REFERENCES

Patent Reference 1 JP 11-230342 A,
Patent Reference 2 JP 2009-299142 A,
Non-Patent Reference 1 Takeo Oki, Surface Technology, Vol. 41, No. 5, 1990, pp. 462-470, and
Non-Patent Reference 2 X. Z. Ding, et al., SIM Tech Technical Reports, Vol. 11, No. 2, 2010, pp. 81-85.

OBJECT OF THE INVENTION

An object of the present invention is to provide a piston ring having high thermal conductivity as well as excellent scuffing resistance and wear resistance, which can be used in a high-heat-load environment in engines, and a piston ring contributing to the improvement of fuel efficiency by low friction.

DISCLOSURE OF THE INVENTION

As a result of intensive research to form a TiN coating having a thickness of about 10-60 μm on a peripheral surface of a piston ring by ion plating while suppressing the peeling, cracking and breakage of the coating, namely, to provide a coating having a structure with low residual stress, the inventors have found that it is possible to reduce residual stress in a TiN coating as thick as 10-60 μm while maintaining scuffing resistance and wear resistance, by optimizing the ion plating conditions of the TiN coating to control the coating to have a columnar crystal structure with crystal orientation in a (111) plane, and with a (220) plane predominant than a (200) plane.

Thus, the piston ring of the present invention comprises a TiN coating having a thickness of 10-60 μm on a peripheral sliding surface, the texture coefficient of a (111) plane of TiN in the X-ray diffraction of a surface of the TiN coating being 1.2-1.65, with the texture coefficient of a (111) plane of TiN>the texture coefficient of a (220) plane of TiN>the texture coefficient of a (200) plane of TiN. Within the above range, the texture coefficient of the (220) plane of TiN is preferably 0.6-1.2.

To achieve excellent sliding characteristics with low friction without deteriorating excellent thermal conductivity of TiN, a hard amorphous carbon coating is preferably formed on the TiN coating. The hard amorphous carbon coating more preferably contains substantially no hydrogen. The hard amorphous carbon coating is preferably as thick as 0.5-10 μm.

To dissipate heat from a piston to a cylinder wall efficiently, not only the coating formed on the peripheral surface of the piston ring but also a substrate of the piston ring desirably have as high thermal conductivity as possible. The substrate of the piston ring preferably contains smaller amounts of alloying elements. Specifically, the substrate preferably has a composition of JIS SUP12, which comprises by mass 0.50-0.60% of C, 1.20-1.60% of Si, 0.50-0.90% of Mn, and 0.50-0.90% of Cr, the balance being Fe and inevitable impurities, more preferably has a composition of JIS SUP10 containing a reduced amount of Si with a small amount of V, which comprises by mass 0.45-0.55% of C, 0.15-0.35% of Si, 0.65-0.95% of Mn, 0.80-1.10% of Cr, and 0.15-0.25% of V, the balance being Fe and inevitable impurities. In the case of a substrate of SUP10, spheroidal cementite having an average particle size of 0.1-1.5 μm is preferably dispersed in an annealed martensite matrix from the aspect of thermal sagging resistance.

Further, when a piston is made of aluminum whose adhesion to piston rings should be prevented, or when a piston ring substrate has lower thermal conductivity than that of the TiN coating, the peripheral surface and at least one of upper and lower side surfaces of the piston ring are preferably provided with a TiN coating with or without a hard amorphous carbon coating. Particularly, a side surface of the piston ring on the combustion chamber side is preferably provided with a hard amorphous carbon coating.

DESCRIPTION OF THE PREFERRED EMBODIMENTS

The piston ring of the present invention comprises a TiN coating as thick as 10-60 μm formed on a peripheral sliding surface, the texture coefficient of a (111) plane of TiN being 1.2-1.65, with the texture coefficient of a (111) plane of TiN>the texture coefficient of a (220) plane of TiN>the texture coefficient of a (200) plane of TiN, in the X-ray diffraction of the TiN coating surface.

The texture coefficient is generally defined by the formula (1):

$$\text{Texture coefficient}=I(hkl)/I_0(hkl)[1/n\Sigma(I(hkl)/I_0(hkl))]^{-1} \quad (1),$$

wherein I(hkl) represents an X-ray diffraction intensity of a (hkl) plane, which is converted to a relative value with the maximum X-ray diffraction intensity measured as 100, and $I_0(hkl)$ represents a standard X-ray diffraction intensity described in JCPDS File No. 38-1420. Though File No. 38-1420 describes standard X-ray diffraction intensities of 10 types of (hkl) planes, (111), (200), (220), (311), (222), (400), (331), (420), (422) and (511), the present invention uses only X-ray diffraction intensities of three types of (hkl) planes, (111), (200) and (220), for simplicity. Accordingly, the texture coefficient is defined in the present invention as $$\text{Texture coefficient}=I(hkl)/I_0(hkl)[\tfrac{1}{3}(I(111)/I_0(111)+I(200)/I_0(200)+I(220)/I_0(220))]^{-1} \quad (2),$$

wherein $I_0(111)$ is 72, $I_0(200)$ is 100, and $I_0(220)$ is 45.

The texture coefficient of 1 means a random structure free of orientation, and the texture coefficient closer to 3 in the formula (2) of the present invention means larger orientation. In the present invention, the texture coefficient of a (111) plane of TiN is 1.2 or more. Also, to avoid strong orientation in the (111) plane, the texture coefficient of the (111) plane of TiN is 1.65 or less. The texture coefficient of the (111) plane of TiN is preferably 1.3-1.65, more preferably 1.35-1.65. The texture coefficient of the (220) plane of TiN is preferably 0.6-1.2. From the aspect of cracking resistance or peeling resistance, the texture coefficient of the (220) plane of TiN is more preferably 0.8 or more, most preferably 1.0 or more. Having the texture coefficient of a (111) plane of TiN in a range of 1.2-1.65, with the texture coefficient of the (111) plane of TiN>the texture coefficient of the (220) plane of TiN>the texture coefficient of the (200) plane of TiN, scuffing resistance and wear resistance is maintained by predominant orientation in the (111) plane, and low residual stress is achieved by reduced orientation in the (200) plane with a relatively high texture coefficient of the (220) plane. As a result, the coating as thick as 10-60 μm can be formed without peeling, cracking and breakage, so that it can be used for piston rings.

In the present invention, the TiN coating is formed by arc ion plating, which comprises introducing a nitrogen ($N_2$) gas into a vacuum chamber, generating arc on a surface of a metal Ti cathode (target), a vapor source, to instantaneously ionize the metal Ti in nitrogen plasma ($N^*$), and attracting $Ti^{3+}$ ions or TiN formed by the reaction of $Ti^{3+}$ ions with $N^*$ to a surface of a piston ring, to which negative bias voltage is applied, thereby forming a thin film. In the arc ion plating, high ionization of the metal Ti can be achieved by a high energy density. Accordingly, a coating having a thickness of 10-60 μm required for a piston ring can be industrially formed at high speed. Though Patent References 1 and 2 teach that the crystal structure of a coating can be controlled by a furnace pressure and bias voltage, a high furnace pressure and low bias voltage providing a columnar structure, and oppositely low furnace pressure and high bias voltage providing a granular structure, the ion plating environment is so extremely complicated that such tendency is not necessarily appreciated in actual processes. For example, when an apparatus is changed, the same structure would not be necessarily obtained surely, even though the same arc current, furnace pressure and bias voltage were used. Of course, not only the material, crystal structure, temperature and surface conditions of the substrate, but also the arrangement of items to be coated and the target in the furnace, etc. have relatively large influence. Accordingly, coating conditions should be set in every apparatus.

In an apparatus used in the present invention, in which the pressure of a nitrogen atmosphere is 1-5 Pa, and the arc current is 90-200 A, the negative bias voltage of 15 V or more makes the orientation of the (200) plane of TiN strong, while meeting the texture coefficient of the (111) plane of TiN>the texture coefficient of the (200) plane of TiN>the texture coefficient of the (220) plane of TiN, and a smaller negative bias voltage reduces the orientation of the (200) plane of TiN, while meeting the texture coefficient of the (111) plane of TiN>the texture coefficient of the (220) plane of TiN>the texture coefficient of the (200) plane of TiN, or the texture coefficient of the (220) plane of TiN>the texture coefficient of the (111) plane of TiN>the texture coefficient of the (200) plane of TiN.

The piston ring of the present invention may further comprise a hard amorphous carbon coating on the TiN coating. In this case, fuel efficiency can be improved by low friction of the hard amorphous carbon coating. The hard amorphous carbon coating can be formed directly on the TiN coating by a known method such as plasma CVD, arc ion plating, etc. The resultant hard amorphous carbon coating is ta-C (tetrahedral amorphous carbon) based on diamond bonds ($sp^3$), which is called "hydrogen-free, diamond-like carbon (DLC)." This coating has particularly high hardness and excellent wear resistance among the hard amorphous carbon coatings. Though depending on density, amorphousness, etc., the hard amorphous carbon coating based on diamond bonds ($sp^3$) has high thermal conductivity. Further, because the hydrogen-free, hard amorphous carbon coating has low friction under lubrication with an automobile gasoline engine oil, friction can be reduced drastically at and near top and bottom dead centers in the reciprocation of pistons in an engine. The thickness of the hard amorphous carbon coating formed on the TiN coating is preferably 0.5-10 μm, more preferably 0.5-8 μm.

The piston ring of the present invention has higher thermal conductivity than that of a CrN-coated piston ring, because TiN per se has higher thermal conductivity than that of CrN. To exhibit sufficient thermal conduction of the piston ring, the substrate of the piston ring also preferably has high thermal conductivity. Because the thermal conduction of a metal is mainly conducted by free electrons in crystal grains, smaller amounts of solid solution elements provide higher thermal conductivity. However, smaller amounts of alloying elements actually provide lower thermal sagging resistance, making a piston ring unusable in a high-heat-load environment. Thus desired is to provide a piston ring substrate for the present invention, which is made of steel having excellent thermal sagging resistance despite small amounts of alloying elements. Specifically, materials corresponding to SUP12 containing an increased amount of Si and a small amount of Cr are preferable, and materials corresponding to SUP10 containing small amounts of Cr and V are more preferable from the aspect of thermal conductivity. In the case of materials corresponding to SUP10, composition control is preferable to have spheroidal cementite having an average particle size of 0.1-1.5 μm dispersed in an annealed martensite matrix for the purpose of improving thermal sagging resistance.

The spheroidal cementite is known as residual cementite in spring steel subject to oil tempering. Excellent thermal sagging resistance obtained in a piston ring suggests that spheroidal cementite remaining in a matrix after oil tempering provides a crystal lattice with strain, making the movement of dislocation unlikely even at 300° C. The spheroidal cementite further preferably has an average particle size of 0.5-1.0 μm. The amount of spheroidal cementite dispersed is preferably 1-6% by area in a microscopically observed structure surface. This preferred dispersion range provides the coating with thermal conductivity of 35 W/m·K or more and a thermal sagging ratio (tangent tension decline according to JIS B 8032-5) of 4% or less. Materials corresponding to SUP12 have thermal conductivity of about 31 W/m·K. The thermal conductivity of about 35 W/m·K is comparable to the thermal conductivity of conventional flaky graphite cast iron piston rings having excellent thermal conductivity.

In the materials corresponding to SUP10, the dispersion of spheroidal cementite having an average particle size of 0.1-1.5 μm in an annealed martensite matrix is achieved by preparing a steel (SUP10) having a composition comprising by mass 0.45-0.55% of C, 0.15-0.35% of Si, 0.65-0.95% of Mn, 0.80-1.10% of Cr, and 0.15-0.25% of V, the balance being Fe and inevitable impurities by melting; hot-rolling it to a wire; and forming the wire into a wire having a predetermined cross section shape through a sequential treatment comprising patenting, acid cleaning, drawing, patenting, acid cleaning, drawing, and oil tempering (oil hardening and tempering), except for conducting spheroidization annealing in place of part of the patenting. The patenting is a heat treatment continuously conducting constant-temperature transformation or cooling transformation in a line heat treatment to obtain a fine pearlite structure, whose temperature range is specifically from about 900° C. to about 600° C.

In the present invention, the annealing step is conducted preferably at a temperature of 600-720° C. equal to or lower than an $A_{C1}$ point in an Fe—C diagram for 30-240 minutes, in place of the patenting treatment. Because spheroidal cementite having a predetermined particle size, which is formed by the spheroidization annealing, is influenced by subsequent heat treatments and influences subsequent drawing, the spheroidization annealing is preferably conducted immediately before the final oil tempering treatment. Accordingly, the spheroidization annealing is conducted preferably in place of the second patenting treatment. In this case, the spheroidization annealing is inevitably a batch treatment, resulting in reduced productivity with a batch treatment introduced into a continuous treatment in a conventional production line. Although the spheroidization annealing may be conducted in place of the first patenting treatment for higher productivity, attention should be paid to have the particle size of spheroidal cementite in a predetermined range.

The oil-tempering treatment is a treatment comprising oil hardening and tempering, in which its temperature and time should be determined to provide a preferred area ratio of spheroidal carbide without dissolving it completely. In the present invention, the hardening step is preferably conducted after heating at a temperature of 820-980° C. for several tens of seconds to several minutes (for example, 30 seconds to 3 minutes), and the tempering step is preferably conducted at a temperature of 400-500° C. for about several tens of seconds to several minutes (for example, 30 seconds to 3 minutes). The heat treatment temperature and time in each treatment should be properly adjusted to provide preferred particle size and area ratio of spheroidal cementite, though variable depending on the size of a heat treatment furnace and a cross section area of an item to be treated.

In the case of an aluminum-made piston, a high combustion chamber temperature softens aluminum, wearing ring grooves and causing the adhesion of aluminum to piston rings. To cope with this problem, at least one of upper and lower side surfaces, preferably a combustion-chamber-side surface, of the piston ring is provided with a coating containing a solid lubricant such as molybdenum disulfide, etc., but in place of this solid lubricant coating, the TiN coating or a hard amorphous carbon coating formed on the TiN coating may be used. The thickness of the coating formed on the side surface may be 1-10 μm, but need not be as thick as the coating on the peripheral surface. Also, when the piston ring substrate is a high-alloy stainless steel having lower thermal conductivity than that of the TiN coating, the TiN coating or the TiN coating and the hard amorphous carbon coating are preferably formed on a peripheral surface and at least one of upper and lower side surfaces, preferably a combustion-chamber-side surface, of the piston ring, to dissipate heat from the piston to a cylinder wall through the piston ring.

Example 1

A SUP12 substrate of 20 mm×20 mm×5 mm shot-blasted to surface roughness (Ry) of several μm, and a target of 99.9-%-pure metallic titanium were set in an arc ion plating apparatus (AIP-3012 available from Kobe Steel, Ltd.). After evacuating the apparatus to $1.0 \times 10^{-2}$ Pa, an Ar gas was introduced to 1.0 Pa, and the substrate was cleaned by bombardment with bias voltage of −600 V to −1,000 V applied. The Ar gas was 99.99% pure. Thereafter, with a 99.999-%-pure $N_2$ gas introduced to 4 Pa, an ion plating treatment was conducted at arc current of 150 V and bias voltage of −8 V for 3 hours. During the treatment, the substrate temperature was about 350° C. A sample of a proper size (for example, 10 mm×10 mm×5 mm) was cut out of the resultant TiN-coated substrate, and the outer surface and cross section surface of the sample were mirror-polished.

[1] X-Ray Diffraction Measurement

Figure 1:
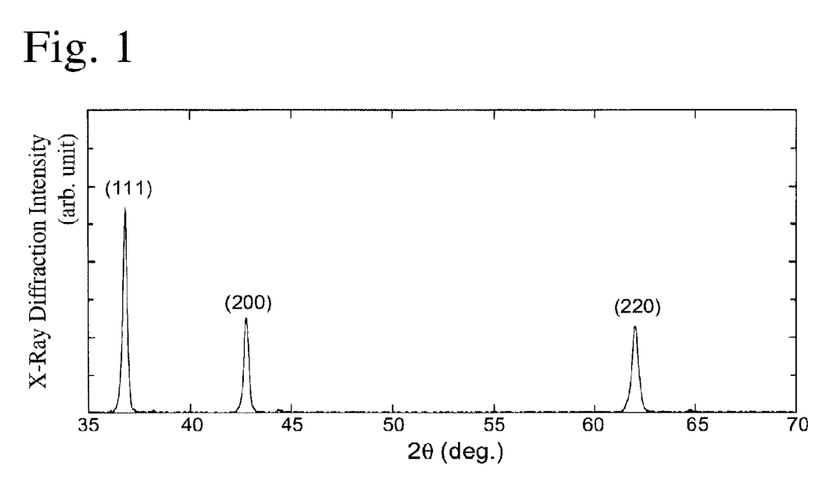
FIG. 1 shows an X-ray diffraction pattern obtained in the present invention (Example 1).

The X-ray diffraction intensity of a mirror-polished surface in parallel to the coating surface was measured with Cu-Kα rays having an X-ray tube voltage of 40 kV and a tube current of 30 mA, in a 2θ range of 35-70° covering the diffraction positions of (111), (200) and (220) planes of TiN. Assuming that the maximum intensity among the three diffraction intensities was 100, the diffraction intensities of the (111), (200) and (220) planes were converted to relative values to determine the texture coefficient of each crystal plane by the formula (2). The X-ray diffraction pattern in Example 1 is shown in FIG. 1. The intensity ratios of these crystal planes were (111):(200):(220)=100:46:43, the texture coefficients of the (111), (200) and (220) planes being 1.49, 0.49 and 1.02, respectively.

[2] Hardness Test

The hardness test of the TiN coating was conducted on a mirror-polished surface in parallel to the coating surface by a micro-Vickers hardness tester at a test force of 0.9807 N. The TiN coating of Example 1 had hardness Hv of 1429.

[3] Measurement of Thickness

Figure 2:
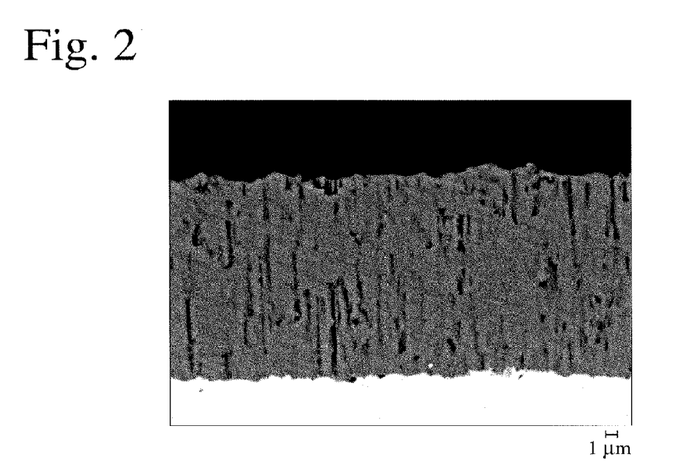
FIG. 2 is a scanning electron photomicrograph showing a vertical cross section of the coating of the present invention (Example 1).

In a scanning electron photomicrograph (SEM photograph) of a mirror-polished cross section perpendicular to the coating surface, the distance from the coating surface to the substrate was measured as a thickness of the sample. FIG. 2 is the SEM photograph. The thickness in Example 1 was 19 μm. It was also observed that the coating (dark gray) had a columnar crystal structure.

[4] Measurement of Thermal Conductivity of Coating

Though a laser flash method is a standard method for measuring the thermal conductivity of a bulk material, it is not suitable for the precise measurement of such a thin sample of 100 μm or less as in the present invention, because a time period until a thermal equilibrium is reached is too short. It is thus considered that "a transient planar source method" such as a hot disc method is preferable for the measurement of the thermal conductivity of the coating of the present invention from the aspect of measurement precision, though there is difference between a planar direction and a thickness direction. A thermal conductivity measurement apparatus used was a hot disc apparatus for measuring thermal characteristics (TPA-501 available from Kyoto Electronics Manufacturing Co., Ltd.).

In the hot disc method, current was supplied to a polyimide-coated double-spiral nickel sensor (thickness: 0.06 mm) sandwiched by two samples, and the electric resistance change of the heated sensor was measured to determine temperature elevation (temperature change), thereby calculating the thermal conductivity. The sample was prepared by providing both surfaces of a substrate (SUS304, 48 mm×48 mm×0.2 mm) having known thermal conductivity with coatings each having a thickness of 50 μm under the same conditions as in Example 1 with the treatment time controlled. Because the hot disc method can measure a thinner plate sample by using analysis software of "Measurement of TPA-SLAB high-thermal-conductivity, thin plate sample," than a laser flash method needing some thickness, a thin coating on a thin substrate can be conveniently measured. The thermal conductivity of the sample in a planar direction was measured by the hot disc method. The thermal conductivity of the coating per se can be calculated, using a ratio of the substrate thickness to the coating thickness, with the influence of the substrate having known thermal conductivity removed. It was presumed that the TiN coating of Example 1 had thermal conductivity of 20.0 W/m·K. Incidentally, the thermal conductivity of a CrN coating is about 5 W/m·K, meaning that the thermal conductivity of the TiN coating is about 4 times as high as that of the CrN coating.

[5] Twisting Test

Figure 3A:
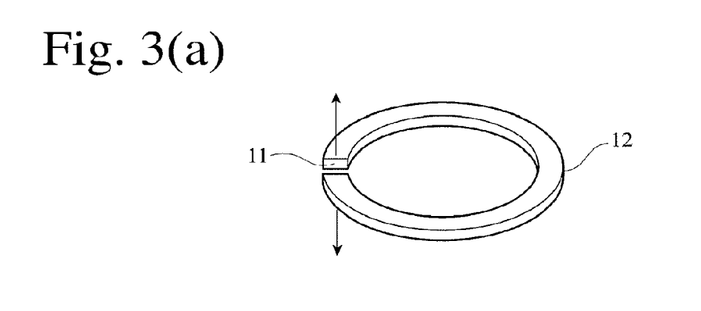
FIG. 3(a) shows the direction of stress applied in a twisting test of a piston ring.
Figure 3B:
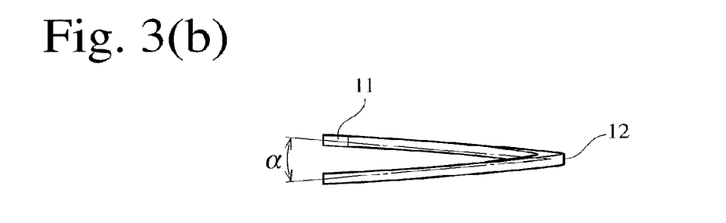
FIG. 3(b) shows a twist angle α in the twisting test of the piston ring.

Because a TiN coating formed on a piston ring by ion plating has extremely large residual compression stress, a thicker TiN coating easily peels from the piston ring, making the TiN-coated piston ring unusable. The residual stress of a coating can be measured from the shift of a peak toward the higher side in X-ray diffraction, but the twisting test of a piston ring was conducted as a more practical evaluation method in place of the measurement of the residual stress of the coating in the present invention. In the twist test, piston ring gap ends are pressed in opposite directions to make the opening of its gap 11 wider as shown in FIG. 3(a), such that a portion 12 of the piston ring opposite to the gap 11 is twisted with a shearing stress between the substrate and the coating, and a twist angle α at which the ion-plated coating peels from the piston ring is measured as shown in FIG. 3(b).

A wire of SUP12 was formed into rectangular-cross-sectioned piston rings each having a nominal diameter (d) of 96.0 mm, a thickness (a1) of 3.8 mm and a width (h1) of 2.5 mm, 50 of which were stacked, and set in an ion plating apparatus to form a coating as thick as about 20 μm on each piston ring under the same conditions as in Example 1. The twisting test revealed that the coatings did not peel from the piston rings even at a twist angle of 180°. It was thus confirmed that the coating formed under the same conditions as in Example 1 had as low residual stress as usable as a piston ring.

[6] Scuffing Test

Figure 4:
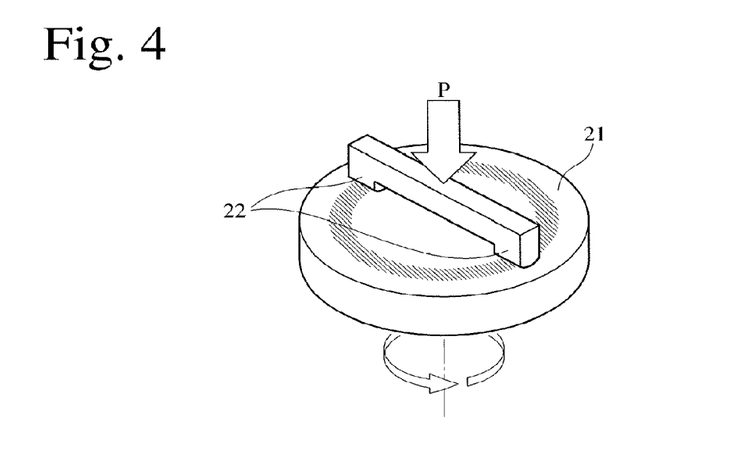
FIG. 4 schematically shows a scuffing test apparatus.

A rod-shaped substrate of SKD61 of 45 mm×5 mm×3.5 mm was prepared, and a 35-mm-long center portion of this 3.5-mm-wide substrate was cut to a depth of 1 mm with portions of 5 mm left on both sides, to form a rod-shaped substrate with projections (pins) of 5 mm×3.5 mm on both sides (see FIG. 4). An end surface of each projection was worked to a curved surface of 20 R around an axis parallel to the rod-shaped substrate. This 20-R curved surface was provided with the coating of Example 1 having a thickness of about 20 μm. The scuffing test was conducted by a vertical-pin-on-disc-type friction wear test machine schematically shown in FIG. 4, in which the coated pins 22 were in contact with a finish-ground disc 21 of SUJ2 of 60 mm in diameter and 10 mm in thickness, and the disc 21 was rotated. While supplying 5 cc/minute of a motor oil #30 (not shown) at 80° C. to a sliding portion near the pin, the disc 21 was rotated at a sliding speed of 8 m/second with a predetermined load P applied to the pins 22, to monitor a friction force generated in the pins 22 by a load cell. The load was increased from an initial value of 100 N stepwise by 20 N and kept for 30 seconds. A load P at which the friction force increased dramatically was regarded as a scuffing-generating load. After the test, the sliding area of the pin was microscopically measured, and the scuffing-generating load was divided by the sliding area to determine a scuffing-generating surface pressure, by which scuffing resistance was evaluated. The scuffing-generating surface pressure was 280 MPa in Example 1.

[7] Wear Test

Figure 5:
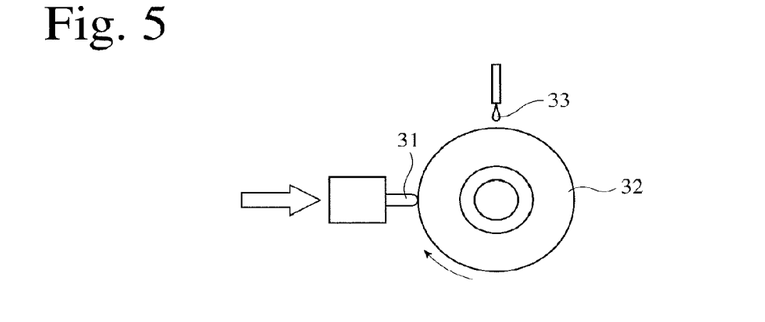
FIG. 5 schematically shows a wear test apparatus.

A substrate of SKD61 of 5 mm×5 mm×20 mm was worked to a test piece 31 having a round tip end with a radius of 10 mm, on which the coating of Example 1 having a thickness of about 20 μm was formed. Using a wear test apparatus schematically shown in FIG. 5, the wear test was conducted for 4 hours, with the coated round tip end of the test piece 31 pressed at a load of 490 N for linear contact onto a curved surface of a drum-shaped sliding mate 32 of FC250 rotating at a speed of 0.5 m/second. With 2 cc/minute of a lubricating oil 33 (motor oil #30) supplied, a surface temperature of the sliding mate 32 was kept at 180° C. The wear of the coating was evaluated by wear depth, and the wear of the sliding mate was evaluated by a worn area determined by cross section profile observation. In Example 1, the wear depth of the coating was 3.5 μm, and the wear of the sliding mate was $0.010 \times 10^{-4}$ cm$^2$.

Examples 2-4 and Comparative Example 1

Each test piece of SUP12 of 20 mm×20 mm×5 mm and each test piece of SUS304 of 48 mm×48 mm×0.2 mm both for thermal conductivity measurement, each rectangular-cross-sectioned piston ring of SUP12 having a nominal diameter (d) of 96.0 mm, a thickness (a1) of 3.8 mm and a width (h1) of 2.5 mm, each rod-shaped substrate of SKD61 of 45 mm×5 mm×3.5 mm, which had pins each having a round surface of 20 R at both ends, and each wear test piece of SKD61 of 5 mm×5 mm×20 mm with a round tip end surface having a radius of 10 mm were ion-plated under the same conditions as in Example 1 except for changing the coating conditions of arc current, nitrogen atmosphere pressure, bias voltage and treatment time as shown in Table 1. The resultant TiN-coated substrates were measured with respect to X-ray diffraction, hardness, thickness, thermal conductivity, twisting, scuffing and wear in the same manner as in Example 1. The results are shown in Tables 2-4. Tables 2-4 also show the coating conditions and various test results of Example 1. Incidentally, a coating of about 50 μm was formed on the test piece for thermal conductivity measurement under all conditions with the treatment time adjusted.

TABLE 1

| | Coating Conditions | | | |
|---|---|---|---|---|
| No. | Arc Current (A) | Nitrogen Atmosphere Pressure (Pa) | Bias Voltage (V) | Treatment Time (hr) |
| Example 1 | 150 | 4 | −8 | 3.0 |
| Example 2 | 150 | 4 | −5 | 3.0 |
| Example 3 | 150 | 3 | −10 | 4.5 |
| Example 4 | 150 | 5 | −8 | 8.0 |
| Com. Ex. 1 | 150 | 3 | −15 | 4.5 |

TABLE 2

| | X-Ray Diffraction Measurement | | | | | |
|---|---|---|---|---|---|---|
| | Peak Intensity Ratio | | | Texture Coefficient | | |
| No. | (111) | (200) | (220) | (111) | (200) | (220) |
| Example 1 | 100 | 46 | 43 | 1.49 | 0.49 | 1.02 |
| Example 2 | 100 | 53 | 50 | 1.38 | 0.52 | 1.10 |
| Example 3 | 100 | 49 | 32 | 1.61 | 0.57 | 0.82 |

TABLE 2-continued

| | X-Ray Diffraction Measurement | | | | | |
|---|---|---|---|---|---|---|
| | Peak Intensity Ratio | | | Texture Coefficient | | |
| No. | (111) | (200) | (220) | (111) | (200) | (220) |
| Example 4 | 100 | 46 | 41 | 1.51 | 0.50 | 0.99 |
| Com. Ex. 1 | 100 | 65 | 19 | 1.69 | 0.79 | 0.51 |

TABLE 3

| | Coating Characteristics | | | |
|---|---|---|---|---|
| No. | Thickness (μm) | Hardness (Hv 0.1) | Thermal Conductivity (W/m · K) | Adhesion Twist Angle (°) |
| Example 1 | 19 | 1429 | 20.0 | 180 |
| Example 2 | 20 | 1360 | 15.9 | 180 |
| Example 3 | 28 | 1583 | 18.3 | 180 |
| Example 4 | 52 | 1467 | 18.1 | 180 |
| Com. Ex. 1 | 25 | 2153 | 27.8 | 97 |

TABLE 4

| | Scuffing Resistance | Wear Resistance | |
|---|---|---|---|
| No. | Scuffing Surface Pressure (MPa) | Wear Depth of Coating (μm) | Wear of Sliding Mate (×10$^{-4}$ cm$^2$) |
| Example 1 | 280 | 3.5 | 0.010 |
| Example 2 | 276 | 3.4 | 0.010 |
| Example 3 | 289 | 3.1 | 0.010 |
| Example 4 | 280 | 3.2 | 0.010 |
| Com. Ex. 1 | 315 | 2.8 | 0.015 |

In Examples 1-4, the texture coefficients of the (111) plane of TiN were 1.38-1.61, the relation of the texture coefficient of a (111) plane of TiN>the texture coefficient of a (220) plane of TiN>the texture coefficient of a (200) plane of TiN was met, and the twist angle keeping adhesion was maximum at 180° even at a thickness of 19-52 μm. Also, they had hardness Hv of 1360-1583, thermal conductivity of 15.9-20.0 W/m·K, a scuffing-generating surface pressure of 276-289 MPa, and wear resistance of 3.1-3.5 μm expressed by the wear depth of the coating. With respect to the scuffing resistance and wear resistance, Examples 3 and 4, in which texture coefficients of the (111) plane of TiN were more than 1.5, had excellent hardness and wear resistance.

Examples 5 and 6

A wire of SUP12 was formed into rectangular-cross-sectioned piston rings each having a nominal diameter (d) of 73.0 mm, a thickness (a1) of 2.3 mm and a width (h1) of 1.0 mm through predetermined steps. In Example 5, the piston ring was provided with a TiN coating as thick as about 20 μm under the same conditions as in Example 1. In Example 6, the piston ring was provided with a TiN coating as thick as about 30 μm under the same conditions as in Example 3. Two piston rings of Example 5 and two piston rings of Example 6 were assembled as top rings in a 1300-cc, L-type, four-cylinder gasoline engine, to conduct an engine test under full load conditions at 4500 rpm for 48 hours. Second rings and oil rings used were known rings. During the test, the engine was operated without knocking.

Examples 7-9

Each rectangular-cross-sectioned piston ring of SUP12 having a nominal diameter (d) of 96.0 mm, a thickness (a1) of 3.8 mm and a width (h1) of 2.5 mm was provided with a TiN coating of about 20 μm under the same conditions as in Example 1. In Examples 8 and 9, a hydrogen-free, hard, amorphous carbon coating of about 1 μm and about 7 μm, respectively, was formed on the TiN coating by arc ion plating. This hydrogen-free, hard, amorphous carbon coating was substantially made of carbon with 5 atomic % or less of hydrogen, exhibiting higher hardness because of a higher diamond bond ratio and thus higher wear resistance than hydrogen-containing hard amorphous carbon coatings containing metals such as Si. Hydrogen in the hard amorphous carbon coating can be measured by an HFS (hydrogen forward scattering) method.

Figure 6:
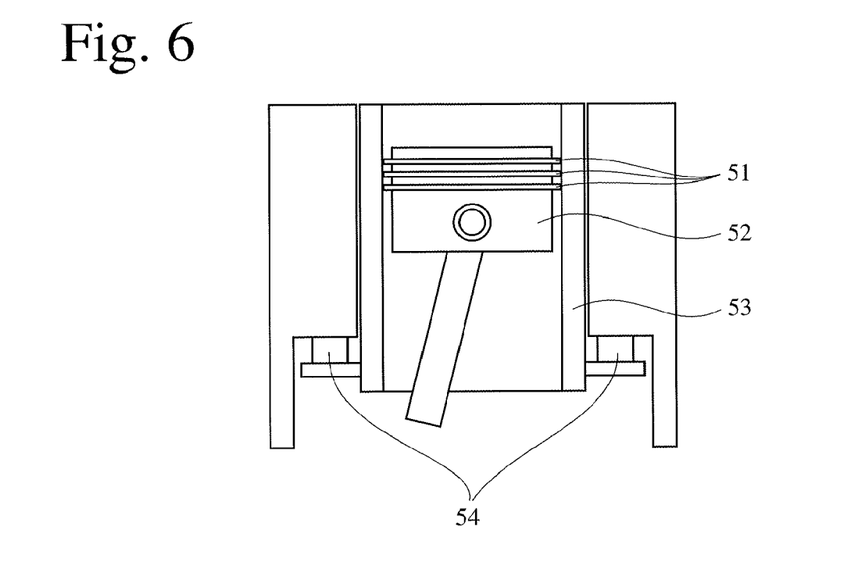
FIG. 6 is a schematic view showing the structure of a floating liner engine for measuring friction.

Each of the resultant TiN-coated piston ring and C/TiN-coated piston rings was assembled in a floating liner engine for measuring friction, to evaluate friction loss by a friction mean effective pressure (FMEP). A member in sliding contact with the piston ring was a cast iron cylinder liner having arithmetic-average roughness (Ra) of 0.2 μm, and a sliding peripheral surface of the piston ring had surface roughness Ra of 0.04 μm. Second rings and oil rings used were known rings as in Examples 5 and 6. FIG. 6 shows the structure of the floating liner engine used for the evaluation of friction. A friction force applied to a cylinder liner 53 was measured by a load sensor 54 bonded to the cylinder liner 53 while piston rings 51 mounted to a piston 52 were sliding up and down. Conditions for measuring the friction loss by the floating liner engine were as follows:

| | |
|---|---|
| The number of revolution of the engine | 1,500 rpm, |
| Load | 15 N·m, |
| The temperature of a lubricating oil | 90° C., and |
| The temperature of cooling water | 100° C. |

The FMEPs of Examples 8 to 10 are shown in Table 5, assuming that the FMEP of Example 7 having only a TiN coating was 100. It was found that the formation of the hard amorphous carbon coating on the TiN coating reduced FMEP by 8-10%. The tensions of top rings, second rings and oil rings were 6 N, 5 N and 20 N, respectively.

TABLE 5

| | Sliding Surface | | Underlying Layer | | |
|---|---|---|---|---|---|
| No. | Coating | Thickness (μm) | Coating | Thickness (μm) | FMEP (Ratio) |
| Example 7 | TiN | 20 | — | — | 100 |
| Example 8 | Hard amorphous carbon coating | 1 | TiN | 20 | 92 |
| Example 9 | Hard amorphous carbon coating | 7 | TiN | 20 | 90 |

Examples 10 and 11

A wire of SUP12 was formed into rectangular-cross-sectioned piston rings each having a nominal diameter (d) of 73.0 mm, a thickness (a1) of 2.3 mm and a width (h1) of 1.0 mm through predetermined steps. In Example 10, a TiN coating of about 20 μm was formed on the piston ring under the same conditions as in Example 8. In Example 11, a TiN coating of about 20 μm was formed on the piston ring under the same conditions as in Example 9. A hard amorphous carbon coating of about 1 μm and about 7 μm, respectively, was then formed on each TiN coating. An engine test conducted under the same conditions as in Examples 5 and 6 revealed that the engine was operated without knocking.

Examples 12 and 13

Figure 7:
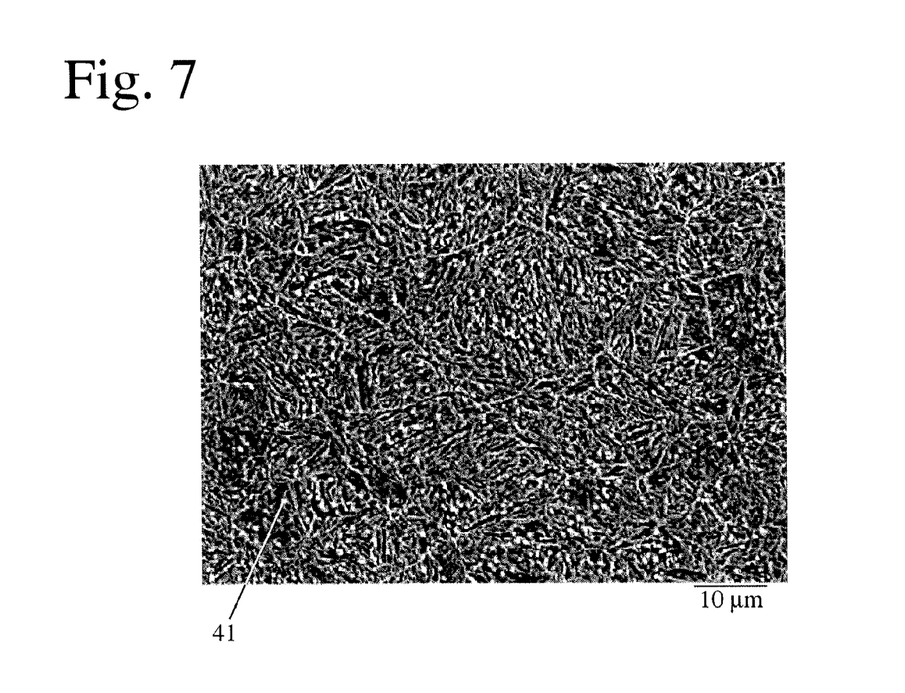
FIG. 7 is a scanning electron photomicrograph of a piston ring wire used in the present invention (Example 11).

A rectangular-cross-sectioned wire of 2.3 mm in thickness and 1.0 mm in width was prepared from a rod of SUP10 rolled to a diameter of 8 mm, through a process comprising heating at 900° C., patenting at 600° C., acid cleaning, drawing, heating at 900° C., patenting at 600° C., acid cleaning, drawing and oil-tempering, with an annealing step at 700° C. for 60 minutes conducted in place of the second patenting. The oil-tempering treatment comprised a heating step at 930° C. for 45 seconds, a hardening step in an oil at 60° C., and then a tempering step at 470° C. for 60 seconds. FIG. 7 is a scanning electron photomicrograph showing the structure of the wire, in which white fine spheroidal cementite 41 dispersed in the tempered martensite was observed. The image analysis of an enlarged photograph of this structure revealed that the spheroidal cementite had an average particle size of 0.8 μm and an area ratio of 2.4%. The above wire was formed into rectangular-cross-sectioned piston rings each having a nominal diameter (d) of 73.0 mm, a thickness (a1) of 2.3 mm and a width (h1) of 1.0 mm in the same manner as in Examples 5 and 6. In Example 12, a TiN coating of about 20 μm was formed on the piston ring under the same conditions as in Example 1. In Example 13, a TiN coating of about 30 μm was formed on the piston ring under the same conditions as in Example 3. An engine test conducted under the same conditions as in Examples 5 and 6 revealed that the engine was operated without knocking.

[8] Measurement of Thermal Conductivity of Piston Ring Wire

The thermal conductivity of a piston ring wire was measured by a laser flash method in Examples 5 and 12. The thermal conductivity of SUP12 in Example 5 was 31 W/m·K, and the thermal conductivity of SUP10 in Example 12 was 38 W/m·K.

DESCRIPTION OF SYMBOLS

11 Gap,
12 Portion opposite to gap,
21 Disc,
22 Pin,
31 Test piece for wear test,
32 Sliding mate,
33 Lubricating oil,
41 Spheroidal cementite,
51 Piston ring,
52 Piston,
53 Cylinder liner, and
54 Load sensor.

Effect of the Invention

Because the piston ring of the present invention having excellent scuffing resistance and wear resistance has a TiN coating having much higher thermal conductivity than that of CrN, which is a coating material widely used for piston rings, it can efficiently dissipate heat from a piston head to a cooled cylinder wall. In addition, because the TiN coating has reduced residual stress while maintaining scuffing resistance and wear resistance even if it is as thick as 10-60 μm, thereby suffering less peeling, cracking and breakage, it can exhibit functions required for piston rings. Thus, it can be used as a piston ring effectively exhibiting thermal conduction. Even when it is used in a high-heat-load environment as in a high-compression-ratio engine, it can suppress knocking without delaying ignition timing, maintaining high heat efficiency. It can also lower the temperature of ring grooves in an aluminum piston, and suppress aluminum adhesion and the wear of ring grooves. When a hard amorphous carbon coating having a small friction coefficient is formed on the outermost sliding surface to exhibit excellent sliding characteristics with low friction, the friction is reduced, resulting in improved fuel efficiency. Particularly in an engine oil environment, the formation of a hydrogen-free, hard amorphous carbon coating can further reduce the friction.

What is claimed is:

1. A piston ring comprising:
    a substrate;
    a TiN coating having a thickness of 10-60 μm on a peripheral sliding surface of the substrate, the texture coefficients of a (111) plane and a (220) plane of TiN in the X-ray diffraction of a surface of said TiN coating being respectively 1.2-1.65 and 1.0-1.2, with the texture coefficient of a (111) plane of TiN>the texture coefficient of a (220) plane of TiN>the texture coefficient of a (200) plane of TiN;
    wherein said TiN coating is formed in a nitrogen atmosphere consisting of $N_2$ gas; and
    wherein said substrate has a composition consisting of, by mass, 0.45-0.55% of C, 0.15-0.35% of Si, 0.65-0.95% of Mn, 0.80-1.10% of Cr, and 0.15-0.25% of V, the balance being Fe and inevitable impurities, and comprises spheroidal cementite having an average particle size of 0.1-1.5 μm dispersed in an annealed martensite matrix.

2. The piston ring according to claim 1, further comprising a amorphous carbon coating formed on said TiN coating.

3. The piston ring according to claim 2, wherein said amorphous carbon coating contains substantially no hydrogen.

4. The piston ring according to claim 2, wherein said amorphous carbon coating has a thickness of 0.5-10 μm.

* * * * *